(12) United States Patent
Okochi

(10) Patent No.: US 10,468,888 B2
(45) Date of Patent: Nov. 5, 2019

(54) CONTROL SYSTEM FOR SOLAR POWER PLANT

(71) Applicant: TOSHIBA MITSUBISHI-ELECTRIC INDUSTRIAL SYSTEMS CORPORATION, Chuo-ku (JP)

(72) Inventor: Toshio Okochi, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 15/516,819

(22) PCT Filed: Dec. 17, 2014

(86) PCT No.: PCT/JP2014/083425
§ 371 (c)(1),
(2) Date: Apr. 4, 2017

(87) PCT Pub. No.: WO2016/098200
PCT Pub. Date: Jun. 23, 2016

(65) Prior Publication Data
US 2017/0294779 A1    Oct. 12, 2017

(51) Int. Cl.
*H02J 3/38*        (2006.01)
*G06F 1/26*        (2006.01)
(Continued)

(52) U.S. Cl.
CPC ........... *H02J 3/383* (2013.01); *G06F 1/26* (2013.01); *H01L 31/02021* (2013.01);
(Continued)

(58) Field of Classification Search
CPC .......... H02J 3/383; H02J 3/40; H02J 13/0013; H02J 3/00; H02J 3/14; H02J 3/32;
(Continued)

(56) References Cited

U.S. PATENT DOCUMENTS 8,373,303 B1 * 2/2013 Daniels .................. H02J 7/35
307/23
8,684,150 B2 * 4/2014 Kumar .................... B60M 3/00
104/289
(Continued)

FOREIGN PATENT DOCUMENTS

CN        103354365 A    10/2013
JP        2009-79559 A    4/2009
(Continued)

OTHER PUBLICATIONS

International Preliminary Report on Patentability and Written Opinion dated Jun. 29, 2017 in PCT/JP2014/083425 (English Translation only).

(Continued)

*Primary Examiner* — Brian W Wathen
*Assistant Examiner* — Alicia M. Choi
(74) *Attorney, Agent, or Firm* — Oblon, McClelland, Maier & Neustadt, L.L.P.

(57) ABSTRACT

A control system for a solar power plant includes: plural power conditioning systems performing grid connection control of transmission of electrical power generated by a solar power generator to a power grid; and a supervisory controller which issues a target output command to each power conditioning system so that interconnection point electrical power, electrical power fed to the power grid, becomes equal to or smaller than an upper limit output value. The supervisory controller: receives an urgent request including information related to a time of day at which the upper limit output value is scheduled to be changed and the scheduled upper limit output value; and calculates a target value of the interconnection point electrical power for each time of day so that the interconnection point electrical power (Continued)

conforms to the scheduled upper limit output value by the scheduled time of day.

5 Claims, 9 Drawing Sheets

(51) Int. Cl.
*H01L 31/02* (2006.01)
*H02J 3/40* (2006.01)
*H02J 13/00* (2006.01)
*H02M 7/49* (2007.01)
*H02S 50/00* (2014.01)

(52) U.S. Cl.
CPC ............ *H02J 3/40* (2013.01); *H02J 13/0013* (2013.01); *H02M 7/49* (2013.01); *H02S 50/00* (2013.01); *Y02E 10/563* (2013.01); *Y02E 40/72* (2013.01); *Y02E 60/7807* (2013.01); *Y04S 10/123* (2013.01); *Y04S 40/12* (2013.01)

(58) Field of Classification Search
CPC ...... G06F 1/26; H01L 31/02021; H02M 7/49; Y02E 10/563; G06Q 50/06; G05F 1/66
USPC .......................................................... 700/286
See application file for complete search history.

(56) References Cited

U.S. PATENT DOCUMENTS

| | | | | |
|---|---|---|---|---|
| 9,509,176 B2* | 11/2016 | Carter | ................... | G06Q 10/06 |
| 9,733,623 B2* | 8/2017 | Yang | .................... | H02J 3/00 |
| 2009/0295162 A1 | 12/2009 | Oohara et al. | | |
| 2010/0057267 A1* | 3/2010 | Liu | ............................ | H02J 3/18 |
| | | | | 700/297 |
| 2010/0145533 A1* | 6/2010 | Cardinal | ................. | H02J 3/383 |
| | | | | 700/291 |
| 2010/0198420 A1* | 8/2010 | Rettger | ..................... | G06F 1/30 |
| | | | | 700/291 |
| 2014/0365023 A1* | 12/2014 | Kiefhaber | .............. | G06Q 50/06 |
| | | | | 700/291 |
| 2015/0039145 A1* | 2/2015 | Yang | ..................... | G05B 13/02 |
| | | | | 700/291 |
| 2015/0107251 A1* | 4/2015 | Buggert | .................. | F01K 13/02 |
| | | | | 60/652 |

FOREIGN PATENT DOCUMENTS

| | | |
|---|---|---|
| JP | 2013-66378 A | 4/2013 |
| JP | 2013-207862 A | 10/2013 |

OTHER PUBLICATIONS

Office Action dated Apr. 1, 2019 in Chinese Application No. 201480083549, along with an English machine translation.
Office Action dated Apr. 1, 2019 in Chinese Application No. 201480083549.X, along with an English machine translation.
International Search Report dated Mar. 17, 2015 in PCT/JP2014/083425 filed Dec. 17, 2014.
Office Action dated Jul. 22, 2019 in corresponding Indian Patent Application No. 201717015689.

* cited by examiner

CONTROL SYSTEM FOR SOLAR POWER PLANT

TECHNICAL FIELD

The present invention relates to a control system for a solar power plant.

BACKGROUND ART

PTL 1 described below discloses a power conditioner which converts DC electrical power from a solar battery into AC electrical power, the power conditioner including a communication unit which receives information related to a power generation amount limit value from an output suppression management device managing a plurality of power conditioners and which transmits information related to a power generation amount of the power conditioner to which the communication unit belongs; and a suppression control unit which suppresses output electrical power of the power conditioner to which the suppression control unit belongs based on the power generation amount limit value.

CITATION LIST

Patent Literature

PTL 1

Japanese Patent Application Laid-open No. 2013-207862

SUMMARY OF INVENTION

Technical Problem

With the system disclosed in PTL 1, calendar information including suppression information representing an output suppression date and a suppression amount is received from a command center or a control center on a side of a commercial grid which supplies commercial electrical power, and a power conditioner controls an output suppression date and a suppression amount according to which output of solar power generation is suppressed based on the calendar information.

An amount of power generation of a solar power plant changes depending on an amount of solar insolation. Therefore, the larger the number of solar power plants, the more difficult it is to maintain a supply-and-demand balance of electrical power and to stabilize a power grid. With the conventional system described above, an output suppression date and a suppression amount are determined based on a prediction of the supply-and-demand balance of electrical power, calendar information including these pieces of suppression information is distributed, and a power conditioner suppresses output of solar power generation based on the calendar information. However, when the prediction of the supply-and-demand balance of electrical power fails or when the weather does not occur as forecast, a suppression amount of solar power generation becomes inappropriate and the power grid can no longer be stabilized.

The present invention has been made in order to solve problems such as that described above and an object is to provide a control system for a solar power plant capable of contributing towards stabilizing a power grid.

Solution to Problem

A control system for a solar power plant according to the present invention includes: a plurality of power conditioning systems, each power conditioning system being configured to perform grid connection control of transmission of electrical power generated by a solar power generator to a power grid; and a supervisory controller configured to issue a target output command to each power conditioning system so that interconnection point electrical power becomes equal to or smaller than an upper limit output value, the interconnection point electrical power being electrical power fed to the power grid. The supervisory controller includes: a receiving unit configured to receive an urgent request including information related to a time of day at which the upper limit output value is scheduled to be changed and a scheduled upper limit output value; and a calculating unit. The calculating unit is configured to: calculate a target value of the interconnection point electrical power for each time of day so that the interconnection point electrical power conforms to the scheduled upper limit output value by the time of day scheduled in the urgent request and that a pace of change in the interconnection point electrical power does not exceed a permissible limit; and calculate a target output of each power conditioning system for each time of day based on the target value.

Advantageous Effects of Invention

With the control system for a solar power plant according to the present invention, by receiving an urgent request including information related to a time of day at which an upper limit output value is scheduled to be changed and the scheduled upper limit output value and controlling interconnection point electrical power, a contribution can be made towards stabilizing a power grid.

DESCRIPTION OF EMBODIMENTS

Hereinafter, embodiments of the present invention will be described with reference to the drawings. Note that common elements in the respective drawings are denoted by same reference signs and overlapping descriptions will be omitted.

First Embodiment

Figure 1:
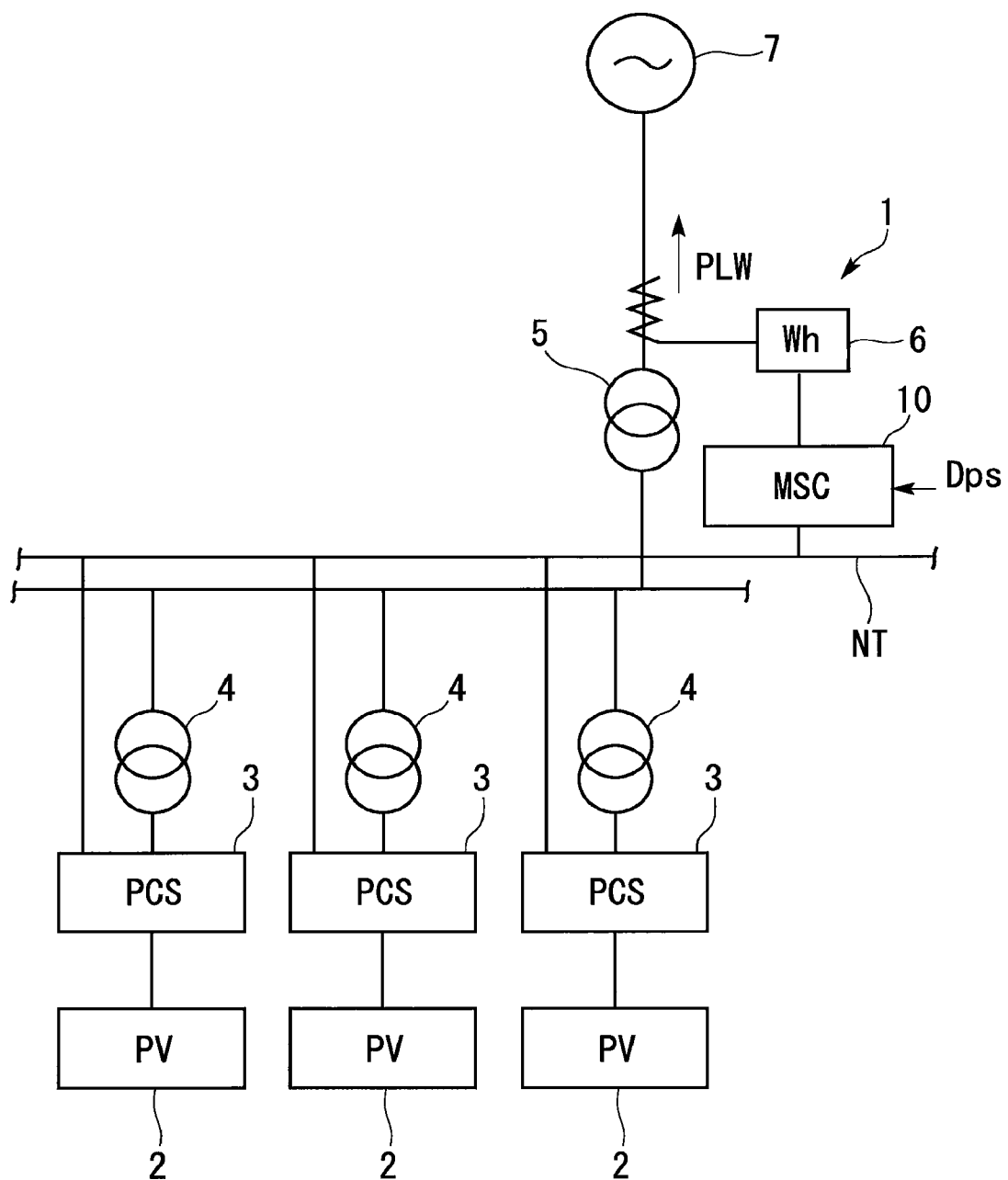
FIG. 1 is a configuration diagram showing a control system for a solar power plant according to a first embodiment of the present invention.

FIG. 1 is a configuration diagram showing a control system for a solar power plant according to a first embodiment of the present invention. As shown in FIG. 1, a control system 1 for a solar power plant according to the present first embodiment includes a plurality of power conditioning systems 3 and a supervisory controller 10 which supervises the power conditioning systems 3. Each power conditioning system 3 is provided in correspondence with each of a plurality of solar power generators 2 provided in the solar power plant. While only three sets of the solar power generators 2 and the power conditioning systems 3 are depicted in FIG. 1, a larger number of the solar power generators 2 and the power conditioning systems 3 may be provided instead.

The supervisory controller 10 and each power conditioning system 3 are connected to each other via a communication network NT so as to be capable of two-way communication.

Each solar power generator 2 generates DC electrical power by converting energy in sunlight into electrical energy. Each solar power generator 2 can be constituted by a plurality of solar battery strings in which a plurality of solar battery modules are arranged in series, each solar battery module being constituted by an arrangement of a large number of cells (solar battery elements). In addition, each solar power generator 2 may be configured such that single solar battery modules are electrically connected in parallel in place of the solar battery strings. DC electrical power generated by each solar power generator 2 is supplied to the corresponding power conditioning system 3.

Each power conditioning system 3 performs grid connection control in which DC electrical power generated by the corresponding solar power generator 2 is converted into AC electrical power and transmitted to a power grid 7. The AC electrical power output by each power conditioning system 3 is transmitted to the power grid 7 via an interconnecting transformer 4 and a main transformer 5. In the present first embodiment, the interconnecting transformer 4 is provided for each power conditioning system 3. An output side of each of the interconnecting transformers 4 is connected to one main transformer 5. An output side of the main transformer 5 is connected to the power grid 7. The power grid 7 is a commercial power transmission facility owned by an electric power company, an electric transmission company, or the like. Electrical power output from the main transformer 5 corresponds to interconnection point electrical power PLW that is electrical power fed to the power grid 7.

Figure 2:
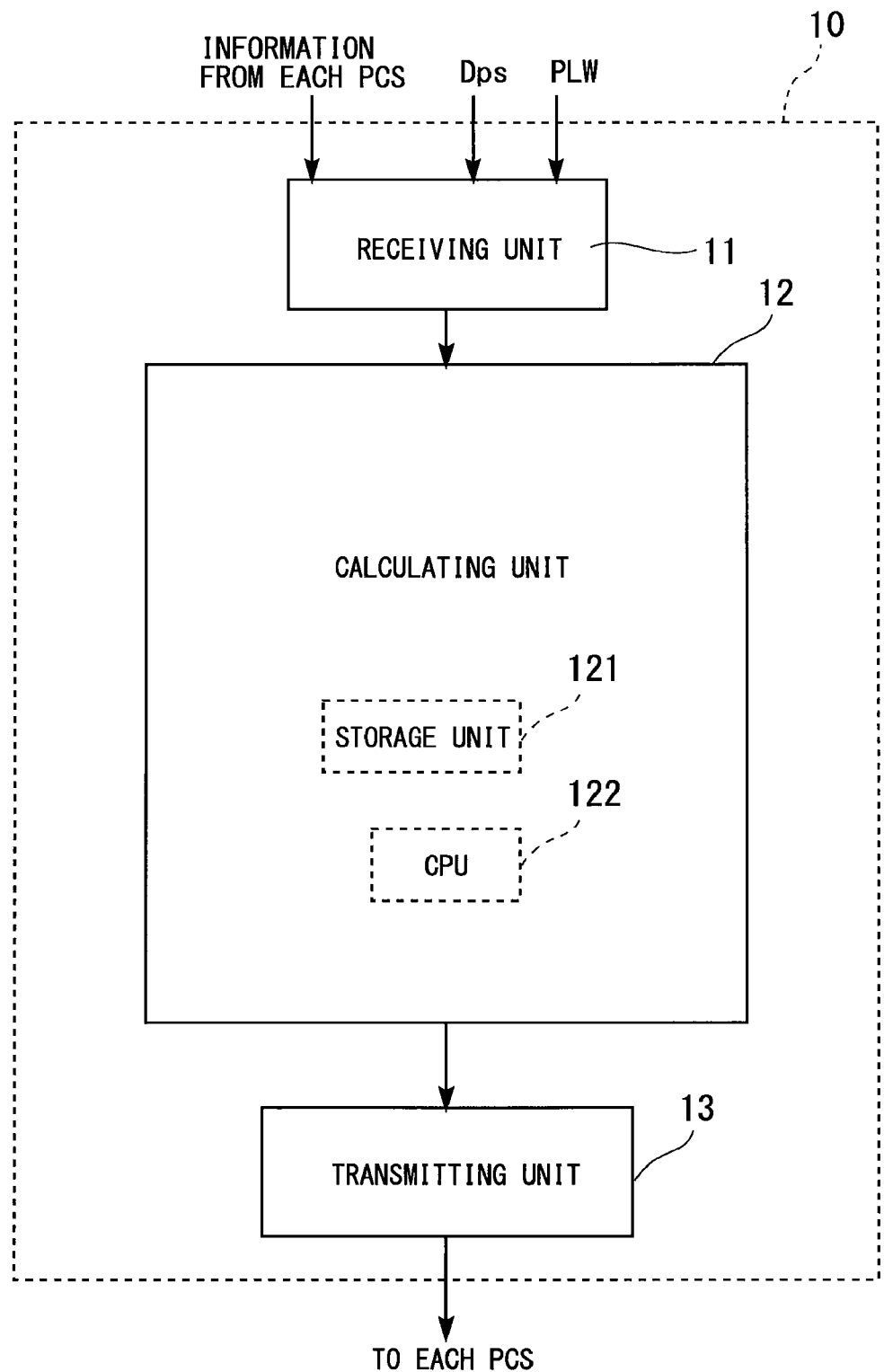
FIG. 2 is a block diagram showing a configuration of a supervisory controller according to the first embodiment.

A wattmeter 6 measures the interconnection point electrical power PLW. Information on the interconnection point electrical power PLW detected by the wattmeter 6 is transmitted to the supervisory controller 10. FIG. 2 is a block diagram showing a configuration of the supervisory controller 10 according to the present first embodiment. As shown in FIG. 2, the supervisory controller 10 includes a receiving unit 11, a calculating unit 12, and a transmitting unit 13. The receiving unit 11 receives information transmitted from each power conditioning system 3, information on the interconnection point electrical power PLW detected by the wattmeter 6, and grid information Dps transmitted from a manager of the power grid 7. The calculating unit 12 calculates an individual target output of each power conditioning system 3 based on the information received by the receiving unit 11. The calculating unit 12 includes a storage unit 121 including a ROM (read only memory), a RAM (random access memory), and a nonvolatile memory, a CPU (central processing unit) 122 which executes an arithmetic operation process based on a control program and data stored in the storage unit 121, and an input/output port which inputs and outputs external signals to and from the CPU 122. The transmitting unit 13 transmits information on the individual target output of each power conditioning system 3 as calculated by the calculating unit 12 to the corresponding power conditioning system 3.

The grid information Dps is transmitted online to the receiving unit 11 of the supervisory controller 10 from a computer system of the manager of the power grid 7, an energy management system of an electric transmission company which manages supply and demand of electrical power of a local area, or the like. However, in the present invention, a configuration may be adopted in which grid information Dps transmitted from the computer system or the energy management system is manually input to the receiving unit 11 of the supervisory controller 10 by a staff member of the solar power plant.

The grid information Dps includes information on an upper limit output value for restricting an upper limit of the interconnection point electrical power PLW. The manager of the power grid 7 sets the upper limit output value so as to stabilize the power grid 7 based on a prediction of a supply-and-demand balance of electrical power. Upon receiving the upper limit output value, the supervisory controller 10 issues a target output command to each power conditioning system 3. The supervisory controller 10 performs control so that the interconnection point electrical power PLW increases as much as possible within a range where the interconnection point electrical power PLW does not exceed the upper limit output value. When a need arises to urgently adjust output of the solar power plant in order to maintain stability of the power grid 7, an urgent request (to be described later) is transmitted as the grid information Dps.

A rated output (W) of the interconnection point electrical power PLW is determined according to a contract between an owner of the solar power plant and the electric power company, the electric transmission company, or the like. In the following description, the rated output of the interconnection point electrical power PLW will be referred to as "interconnection rated electrical power". In addition, the upper limit output value and the interconnection point electrical power PLW may be represented by a percentage when interconnection rated electrical power is 100%. Alternatively, the upper limit output value and the interconnection point electrical power PLW may be represented by electrical power units (W).

Each power conditioning system 3 includes an electrical power conversion unit which converts electrical power input from the corresponding solar power generator 2, a communication unit for communicating with the supervisory controller 10 via the communication network NT, a storage unit which stores various data and a control program, a measurement unit which measures an amount of power generation and the like of the corresponding solar power generator 2, and a control unit which controls operations of the respective units.

Each power conditioning system 3 desirably has a function of performing MPPT (Maximum Power Point Tracking) control for tracking a maximum electrical power point of the corresponding solar power generator 2. In addition, each power conditioning system 3 has a function of controlling an operation point (voltage and current) of the corresponding solar power generator 2 so that the electrical power generated by the solar power generator 2 matches a target output received from the supervisory controller 10. Since such a power conditioning system 3 is well known, a detailed description thereof will be omitted.

The grid information Dps can include an urgent request which is a request for urgently changing the upper limit output value. The urgent request includes information related to a time of day at which the upper limit output value is scheduled to be changed and the scheduled upper limit output value. Hereinafter, a time of day at which the upper limit output value is scheduled to be changed in the urgent request will be referred to as an "scheduled time of day of change". In the present first embodiment, the urgent request is to be transmitted to the receiving unit 11 of the supervisory controller 10 15 minutes before the scheduled time of day of change. In the present invention, the time of day at which the supervisory controller 10 receives the urgent request is not limited to 15 minutes before the scheduled time of day of change and may instead be, for example, a time of day preceding the scheduled time of day of change by a period set in advance such as 30 minutes, 20 minutes, or 10 minutes before the scheduled time of day of change.

An abrupt change in the interconnection point electrical power PLW may have an adverse effect on the stability of the power grid 7. In order to prevent such an effect, a permissible limit is set to a pace of change of the interconnection point electrical power PLW. The supervisory controller 10 performs control so that the pace of change of the interconnection point electrical power PLW does not exceed the permissible limit. As an example, in the present first embodiment, it is assumed that keeping an amount of change (an amount of increase or an amount of reduction) of the interconnection point electrical power PLW per minute to 12% or less of the interconnection rated electrical power is set as the permissible limit.

When the receiving unit 11 of the supervisory controller 10 receives the urgent request, the calculating unit 12 calculates a target value of the interconnection point electrical power PLW for each time of day so that the interconnection point electrical power PLW conforms to the scheduled upper limit output value by the scheduled time of day of change and that the pace of change of the interconnection point electrical power PLW does not exceed the permissible limit. In addition, the calculating unit 12 calculates a target output of each power conditioning system 3 for each time of day based on the target value of the interconnection point electrical power PLW for each time of day.

Figure 3:
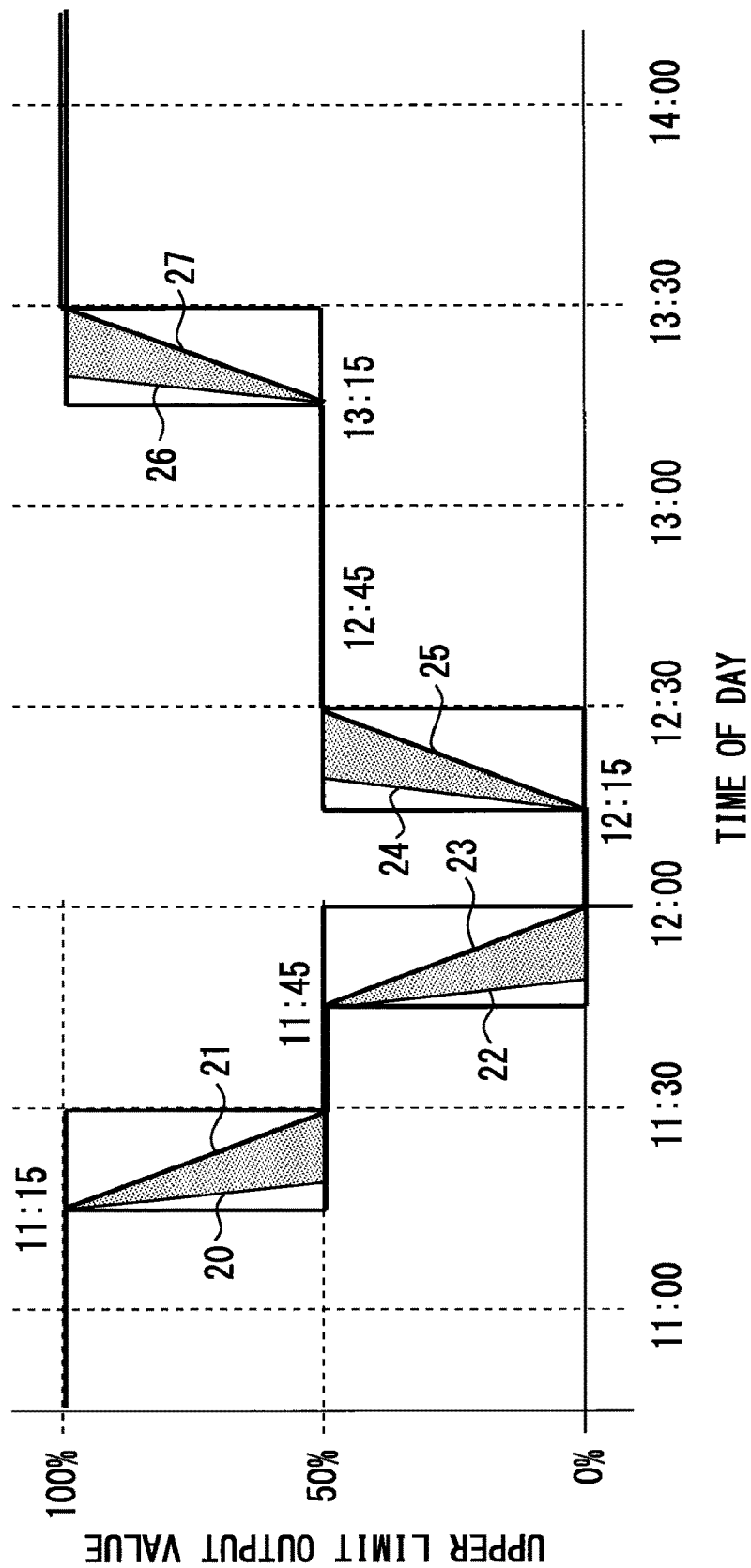
FIG. 3 is a time chart for explaining a method by which the supervisory controller calculates a target value of interconnection point electrical power PLW for each time of day according to the first embodiment.

FIG. 3 is a time chart for explaining a method by which the supervisory controller 10 calculates a target value of the interconnection point electrical power PLW for each time of day according to the present first embodiment. Hereinafter, a method by which the supervisory controller 10 calculates a target value of the interconnection point electrical power PLW for each time of day will be described with reference to the example shown in FIG. 3.

In the example shown in FIG. 3, initially, the upper limit output value is 100%. The upper limit output value being 100% corresponds to an absence of a request to reduce output of the solar power plant. Subsequently, an urgent request is received at 11:15 (h:m). This urgent request notifies that the upper limit output value is scheduled to be changed at 11:30 from 100% to 50%. In the present first embodiment, the supervisory controller 10 performs control so as to start reducing or increasing the interconnection point electrical power PLW at the time of day at which the urgent request is received. In this case, in response to the urgent request, the supervisory controller 10 starts reducing the interconnection point electrical power PLW at 11:15 and reduces the interconnection point electrical power PLW to 50% by 11:30 which is the scheduled time of day of change. A line 20 in FIG. 3 corresponds to a case where the interconnection point electrical power PLW is reduced at a most rapid permissible pace of change. In this case, obtaining an amount of change corresponding to 50% of the interconnection rated electrical power at the permissible limit (12% of interconnection rated electrical power/minute) of the pace of change of the interconnection point electrical power PLW requires 4 minutes and 10 seconds. Therefore, in the case of the line 20, the interconnection point electrical power PLW drops at a constant pace (a pace equivalent to the permissible limit) from 100% at 11:15 to 50% at 11:19:10 (h:m:s). A line 21 in FIG. 3 corresponds to a case where the interconnection point electrical power PLW is reduced at a most gradual rate within a range satisfying the urgent request. In the case of the line 21, the interconnection point electrical power PLW drops at a constant pace from 100% at 11:15 to 50% at 11:30.

The supervisory controller 10 sets a line along which the target value of the interconnection point electrical power PLW for each time of day is changed to be within a range (a permissible range) between the line 20 and the line 21. Accordingly, since an abrupt change in the interconnection point electrical power PLW can be prevented while accommodating the urgent request, contributions can be made toward stability of the power grid 7.

When the interconnection point electrical power PLW is reduced along the line 21, an amount of electrical power to be transmitted to the power grid 7 or, in other words, an amount of sold electrical power can be increased as compared to when the interconnection point electrical power PLW is reduced along the line 20. Therefore, when reducing the interconnection point electrical power PLW in response to an urgent request, the supervisory controller 10 desirably slows down the pace of change of the interconnection point electrical power PLW as much as possible within the permissible range. In other words, when receiving the urgent request at 11:15, the supervisory controller 10 desirably calculates the target value of the interconnection point electrical power PLW for each time of day along the line 21 or a nearby line.

In the example shown in FIG. 3, subsequently, an urgent request is received at 11:45. This urgent request notifies that the upper limit output value is scheduled to be changed at 12:00 from 50% to 0%. In this case, in response to the urgent request, the supervisory controller 10 starts reducing the interconnection point electrical power PLW at 11:45 and reduces the interconnection point electrical power PLW to 0% by 12:00 which is the scheduled time of day of change. A line 22 in FIG. 3 corresponds to a case where the interconnection point electrical power PLW is reduced at a most rapid permissible pace of change. In the case of the line 22, the interconnection point electrical power PLW drops at a constant pace (a pace equivalent to the permissible limit) from 50% at 11:45 to 0% at 11:49:10 seconds. A line 23 in FIG. 3 corresponds to a case where the interconnection point electrical power PLW is reduced at a most gradual rate within a range satisfying the urgent request. In the case of the line 23, the interconnection point electrical power PLW drops at a constant pace from 50% at 11:45 to 0% at 12:00.

The supervisory controller 10 sets a line along which the target value of the interconnection point electrical power PLW for each time of day is changed to be within a range (a permissible range) between the line 22 and the line 23. Accordingly, since an abrupt change in the interconnection point electrical power PLW can be prevented while accommodating the urgent request, contributions can be made toward stability of the power grid 7.

When the interconnection point electrical power PLW is reduced along the line 23, an amount of electrical power to be transmitted to the power grid 7 or, in other words, an amount of sold electrical power can be increased as compared to when the interconnection point electrical power PLW is reduced along the line 22. Therefore, when reducing the interconnection point electrical power PLW in response to an urgent request, the supervisory controller 10 desirably slows down the pace of change of the interconnection point electrical power PLW as much as possible within the permissible range. In other words, when receiving the urgent request at 11:45, the supervisory controller 10 desirably calculates the target value of the interconnection point electrical power PLW for each time of day along the line 23 or a nearby line.

In the example shown in FIG. 3, subsequently, an urgent request is received at 12:15. This urgent request notifies that the upper limit output value is scheduled to be changed at 12:30 from 0% to 50%. In this case, in response to the urgent request, the supervisory controller 10 starts increasing the interconnection point electrical power PLW at 12:15 and causes the interconnection point electrical power PLW to rise to 50% by 12:30 which is the scheduled time of day of change. A line 24 in FIG. 3 corresponds to a case where the interconnection point electrical power PLW is increased at a most rapid permissible pace of change. In the case of the line 24, the interconnection point electrical power PLW rises at a constant pace (a pace equivalent to the permissible limit) from 0% at 12:15 to 50% at 12:19:10 seconds. A line 25 in FIG. 3 corresponds to a case where the interconnection point electrical power PLW is increased at a most gradual rate within a range satisfying the urgent request. In the case of the line 25, the interconnection point electrical power PLW rises at a constant pace from 0% at 12:15 to 50% at 12:30.

The supervisory controller 10 sets a line along which the target value of the interconnection point electrical power PLW for each time of day is changed to be within a range (a permissible range) between the line 24 and the line 25. Accordingly, since an abrupt change in the interconnection point electrical power PLW can be prevented while accommodating the urgent request, contributions can be made toward stability of the power grid 7.

When the interconnection point electrical power PLW is increased along the line 24, an amount of electrical power to be transmitted to the power grid 7 or, in other words, an amount of sold electrical power can be increased as compared to when the interconnection point electrical power PLW is increased along the line 25. Therefore, when increasing the interconnection point electrical power PLW in response to an urgent request, the supervisory controller 10 desirably speeds up the pace of change of the interconnection point electrical power PLW as much as possible within the permissible range. In other words, when receiving the urgent request at 12:15, the supervisory controller 10 desirably calculates the target value of the interconnection point electrical power PLW for each time of day along the line 24 or a nearby line.

In the example shown in FIG. 3, subsequently, an urgent request is received at 13:15. This urgent request notifies that the upper limit output value is scheduled to be changed at 13:30 from 50% to 100%. In this case, in response to the urgent request, the supervisory controller 10 starts increasing the interconnection point electrical power PLW at 13:15 and causes the interconnection point electrical power PLW to rise to 100% by 13:30 which is the scheduled time of day of change. A line 26 in FIG. 3 corresponds to a case where the interconnection point electrical power PLW is increased at a most rapid permissible pace of change. In the case of the line 26, the interconnection point electrical power PLW rises at a constant pace (a pace equivalent to the permissible limit) from 50% at 13:15 to 100% at 13:19:10 seconds. A line 27 in FIG. 3 corresponds to a case where the interconnection point electrical power PLW is increased at a most gradual rate within a range satisfying the urgent request. In the case of the line 27, the interconnection point electrical power PLW rises at a constant pace from 50% at 13:15 to 100% at 13:30.

The supervisory controller 10 sets a line along which the target value of the interconnection point electrical power PLW for each time of day is changed to be within a range (a permissible range) between the line 26 and the line 27. Accordingly, since an abrupt change in the interconnection point electrical power PLW can be prevented while accommodating the urgent request, contributions can be made toward stability of the power grid 7.

When the interconnection point electrical power PLW is increased along the line 26, an amount of electrical power to be transmitted to the power grid 7 or, in other words, an amount of sold electrical power can be increased as compared to when the interconnection point electrical power PLW is increased along the line 27. Therefore, when increasing the interconnection point electrical power PLW in response to an urgent request, the supervisory controller 10 desirably speeds up the pace of change of the interconnection point electrical power PLW as much as possible within the permissible range. In other words, when receiving the urgent request at 13:15, the supervisory controller 10 desirably calculates the target value of the interconnection point electrical power PLW for each time of day along the line 26 or a nearby line.

Figure 4:
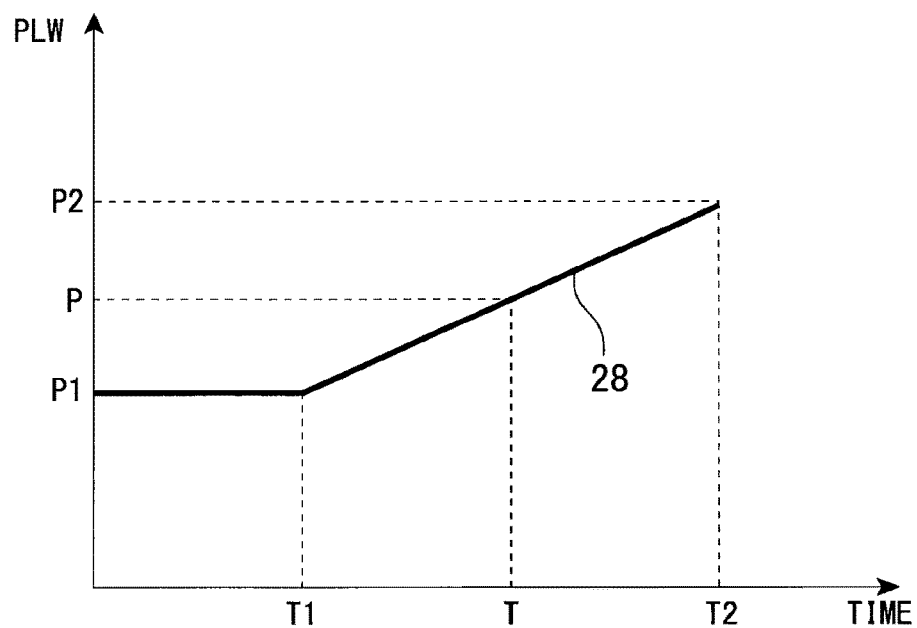
FIG. 4 is a graph for explaining a method by which the supervisory controller calculates a target value of the interconnection point electrical power PLW for each time of day according to the first embodiment.

FIG. 4 is a graph for explaining a method by which the supervisory controller 10 calculates a target value of the interconnection point electrical power PLW for each time of day according to the present first embodiment. In the example shown in FIG. 4, the interconnection point electrical power PLW is changed along a line 28 from P1 at a time of day T1 to P2 at a time of day T2. A target value P of the interconnection point electrical power PLW at an arbitrary time of day T between the time of day T1 and the time of day T2 can be calculated according to the following equation.

$$P(P2-P1)/(T2-T1) \times T + (P1 \times T2 - P2 \times T1)/(T2-T1) \quad (1)$$

When an urgent request is received, the supervisory controller 10 determines a line along which the target value P of the interconnection point electrical power PLW is to be changed as described with reference to FIG. 3, and calculates the target value P of the interconnection point electrical power PLW for each time of day according to Equation (1) above. For example, when receiving the urgent request at 12:15 shown in FIG. 3 and increasing the interconnection point electrical power PLW along the line 24, it is assumed that T1=12:15, T2=12:19:10 seconds, P1=interconnection rated electrical power×0%, and P2=interconnection rated electrical power×50%. The interconnection point electrical power PLW is reduced in a similar manner. For example, when receiving the urgent request at 11:15 shown in FIG. 3 and reducing the interconnection point electrical power PLW along the line 21, it is assumed that T1=11:15, T2=11:30, P1=interconnection rated electrical power×100%, and P2=interconnection rated electrical power×50%.

Figure 5:
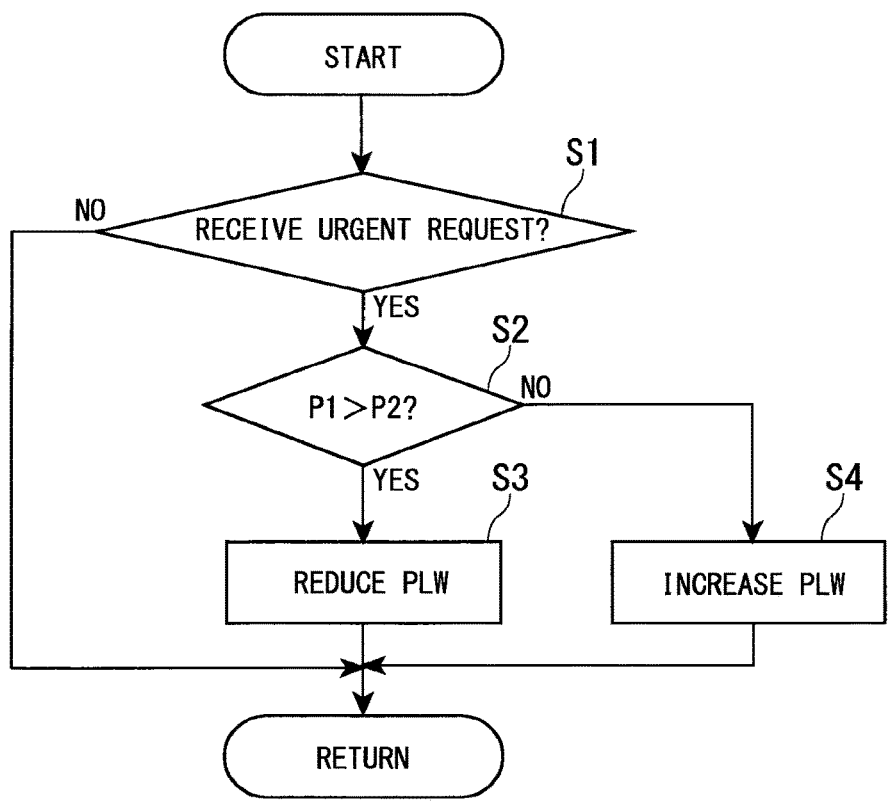
FIG. 5 is a flow chart showing a process by which the supervisory controller sets a target value P of the interconnection point electrical power PLW in response to an urgent request according to the first embodiment.

FIG. 5 is a flow chart showing a process by which the supervisory controller 10 sets a target value P of the interconnection point electrical power PLW in response to an urgent request according to the present first embodiment. In step S1 shown in FIG. 5, a determination is made as to whether or not the receiving unit 11 of the supervisory controller 10 has received an urgent request. When an urgent request is received, a transition is made to step S2. In step S2, the calculating unit 12 of the supervisory controller 10 compares P1 which is an output corresponding to the upper limit output value before change in accordance with the urgent request (or the current interconnection point electrical power PLW) with P2 which is an output corresponding to the scheduled upper limit output value in accordance with the urgent request. When P1>P2, a transition is made from step S2 to step S3. When P1<P2, a transition is made from step S2 to step S4.

P1>P2 (step S3) corresponds to a case where the interconnection point electrical power PLW is to be reduced in response to the urgent request. In this case, the calculating unit 12 of the supervisory controller 10 determines a line along which the target value P of the interconnection point electrical power PLW is to be reduced as in the case of the urgent request at 11:15 or 11:45 shown in FIG. 3. Due to the reasons described above, in this case, a line along which the target value P of the interconnection point electrical power PLW is to be reduced is desirably determined such that the pace of change of the interconnection point electrical power PLW is slowed down as much as possible within the permissible range.

P1<P2 (step S4) corresponds to a case where the interconnection point electrical power PLW is to be increased in response to the urgent request. In this case, the calculating unit 12 of the supervisory controller 10 determines a line along which the target value P of the interconnection point electrical power PLW is to be increased as in the case of the urgent request at 12:15 or 13:15 shown in FIG. 3. Due to the reasons described above, in this case, a line along which the target value P of the interconnection point electrical power PLW is to be increased is desirably determined such that the pace of change of the interconnection point electrical power PLW is sped up as much as possible within the permissible range.

As described above, the supervisory controller 10 desirably speeds up the pace at which the interconnection point electrical power PLW is to be increased in response to an urgent request as compared to the pace at which the interconnection point electrical power PLW is to be reduced in response to an urgent request. In other words, the supervisory controller 10 desirably sets an absolute value of the pace at which the interconnection point electrical power PLW is to be increased in response to an urgent request to be larger than an absolute value of the pace at which the interconnection point electrical power PLW is to be reduced in response to an urgent request. Accordingly, an amount of electrical power to be transmitted to the power grid 7 or, in other words, an amount of sold electrical power can be increased.

Figure 6:
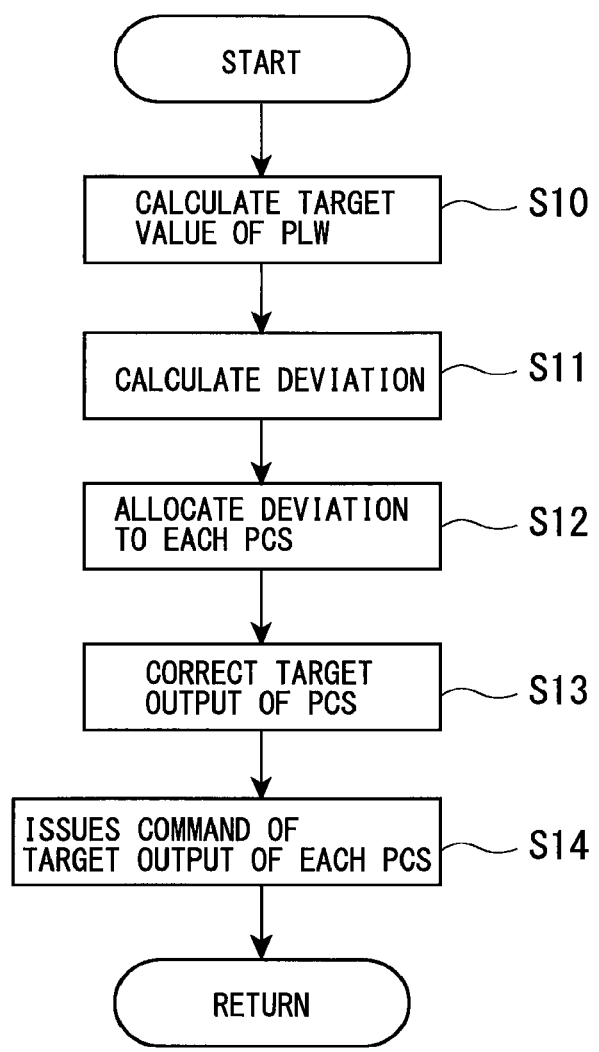
FIG. 6 is a flow chart showing a process by which the supervisory controller controls each power conditioning system according to the first embodiment.

FIG. 6 is a flow chart showing a process by which the supervisory controller 10 controls each power conditioning system 3 according to the present first embodiment. In step S10 shown in FIG. 6, the calculating unit 12 of the supervisory controller 10 calculates the target value P of the interconnection point electrical power PLW at the current time of day. Specifically, the calculating unit 12 calculates the target value P of the interconnection point electrical power PLW at the current time of day based on a line along which the target value P of the interconnection point electrical power PLW is to be changed as determined in step S3 or step S4 shown in FIG. 5 and on Equation (1) presented above. The supervisory controller 10 makes a transition from step S10 to step S11. In step S11, the calculating unit 12 calculates a deviation ΔP between the target value P of the interconnection point electrical power PLW at the current time of day and the actual interconnection point electrical power PLW as measured by the wattmeter 6.

The supervisory controller 10 makes a transition from step S11 to step S12. In step S12, the calculating unit 12 calculates a target output of each power conditioning system 3 by allocating the deviation ΔP calculated in step S11 to each power conditioning system 3. For example, if p denotes current output electrical power of each power conditioning system 3 and n denotes the number of power conditioning systems 3, then (p+ΔP/n) is calculated as the target output of each power conditioning system 3.

The supervisory controller 10 makes a transition from step S12 to step S13. In step S13, the calculating unit 12 corrects the target output of the power conditioning system 3 calculated in step S12 as follows. Output of each power conditioning system 3 may differ depending on a state of solar insolation on each solar power generator 2 and the like. For example, when the solar power generator 2 at a given location becomes shadowed by a moving cloud, output of the corresponding power conditioning system 3 decreases. For a similar reason, a maximum output pmax of each power conditioning system 3 at a given moment may differ depending on a state of solar insolation on each solar power generator 2 and the like. For a power conditioning system 3 of which the target output (p+ΔP/n) calculated in step S11 exceeds the current maximum output pmax, the calculating unit 12 performs a correction so as to set a value equal to the maximum output pmax as the target output. A minimum output pmin of each power conditioning system 3 is usually zero. When ΔP is a negative value, the target output (p+ΔP/n) calculated in step S11 may be smaller than the minimum output pmin. For a power conditioning system 3 of which the target output (p+ΔP/n) calculated in step S11 is smaller than the minimum output pmin, the calculating unit 12 performs a correction so as to set a value equal to the minimum output pmin as the target output. When the target output of a part of the power conditioning systems 3 is corrected as described above, an amount of increase or decrease as a result of the correction can be reallocated to the target output of the remaining power conditioning systems 3.

The supervisory controller 10 makes a transition from step S13 to step S14. In step S14, the transmitting unit 13 issues a command of the target output of each power conditioning system 3 as calculated through steps S12 and S13 to each power conditioning system 3.

The supervisory controller 10 periodically (for example, every second) and repetitively executes the process represented by the flow chart shown in FIG. 6. Accordingly, the interconnection point electrical power PLW can be changed along a line of the target value P. In the present first embodiment, by performing the process described above, the supervisory controller 10 can calculate a target output of each power conditioning system 3 such that a shortage of output in a part of the power conditioning systems 3 is compensated for with output of other power conditioning systems 3 having surplus power. Therefore, in a case where, for example, a part of the solar power generators 2 become shadowed by clouds and cause output shortage at a part of the power conditioning systems 3, a reduction in the interconnection point electrical power PLW can be prevented by increasing the output of other power conditioning systems 3 having surplus power.

Figure 7:
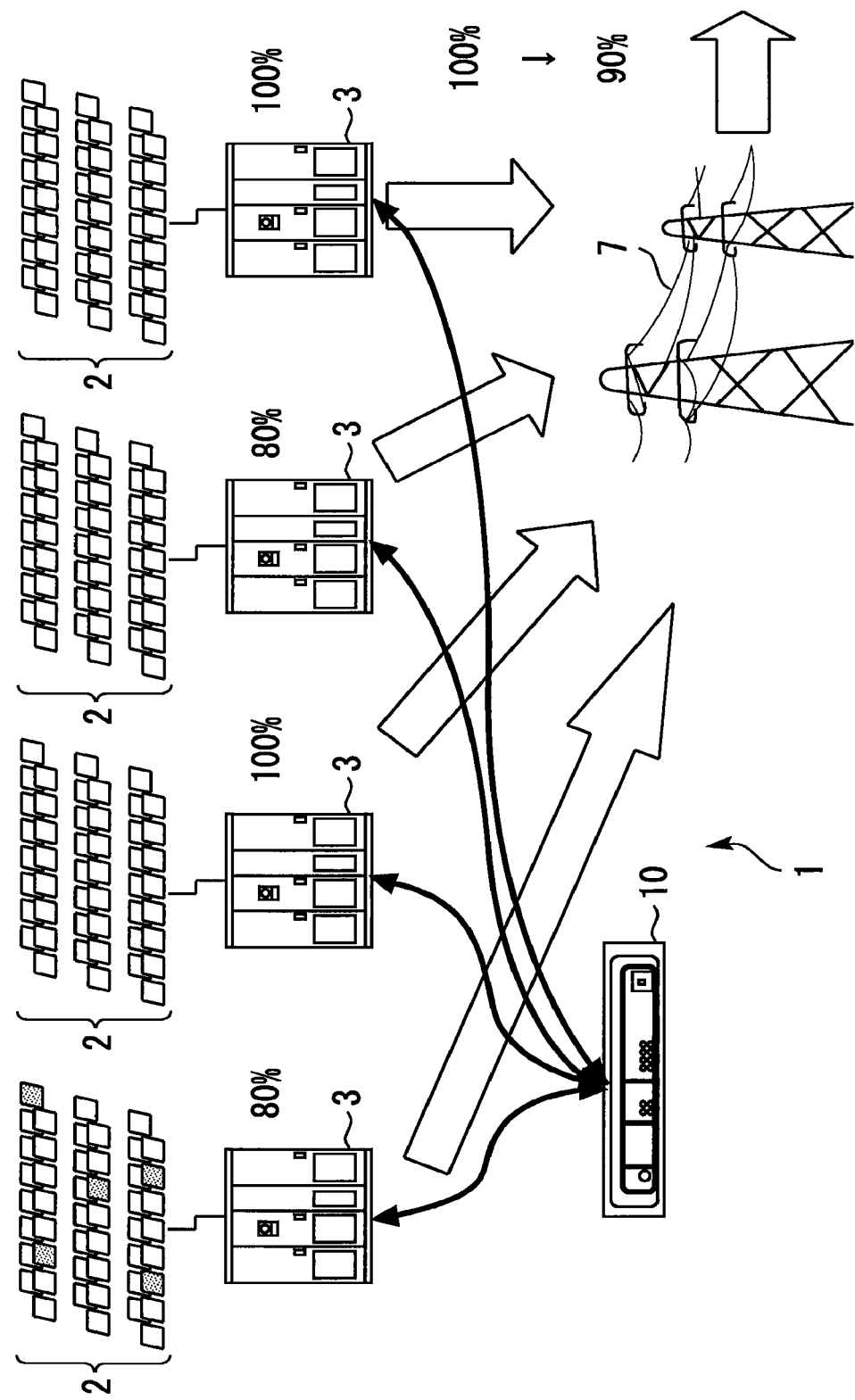
FIG. 7 is a diagram schematically showing a state where a shortage of output in a part of power conditioning systems is compensated for with output of other power conditioning systems having surplus power in the control system for a solar power plant according to the first embodiment.

FIG. 7 is a diagram schematically showing a state where a shortage of output in a part of the power conditioning systems 3 is compensated for with output of other power conditioning systems 3 having surplus power in the control system 1 for a solar power plant according to the present first embodiment. In the example shown in FIG. 7, for the sake of brevity, it is assumed that there are four power conditioning systems 3 and the upper limit output value is set at 90%. With the second from right power conditioning system 3 in FIG. 7, output has dropped to 80% of rated output due to the corresponding solar power generator 2 being shadowed by a cloud. With the leftmost power conditioning system 3 in FIG. 7, output has dropped to 80% of rated output due to deterioration of the corresponding solar power generator 2. In order to compensate for the shortage of output of these power conditioning systems 3, the supervisory controller 10 can make the interconnection point electrical power PLW match the upper limit output value (90%) by adjusting the outputs of the rightmost and third from right power conditioning systems 3 in FIG. 7 to 100%. In this manner, by compensating for a shortage of output in a part of the power conditioning systems 3 with output of other power conditioning systems 3 having surplus power, an amount of electrical power to be transmitted to the power grid 7 or, in other words, an amount of sold electrical power can be increased.

Figure 8:
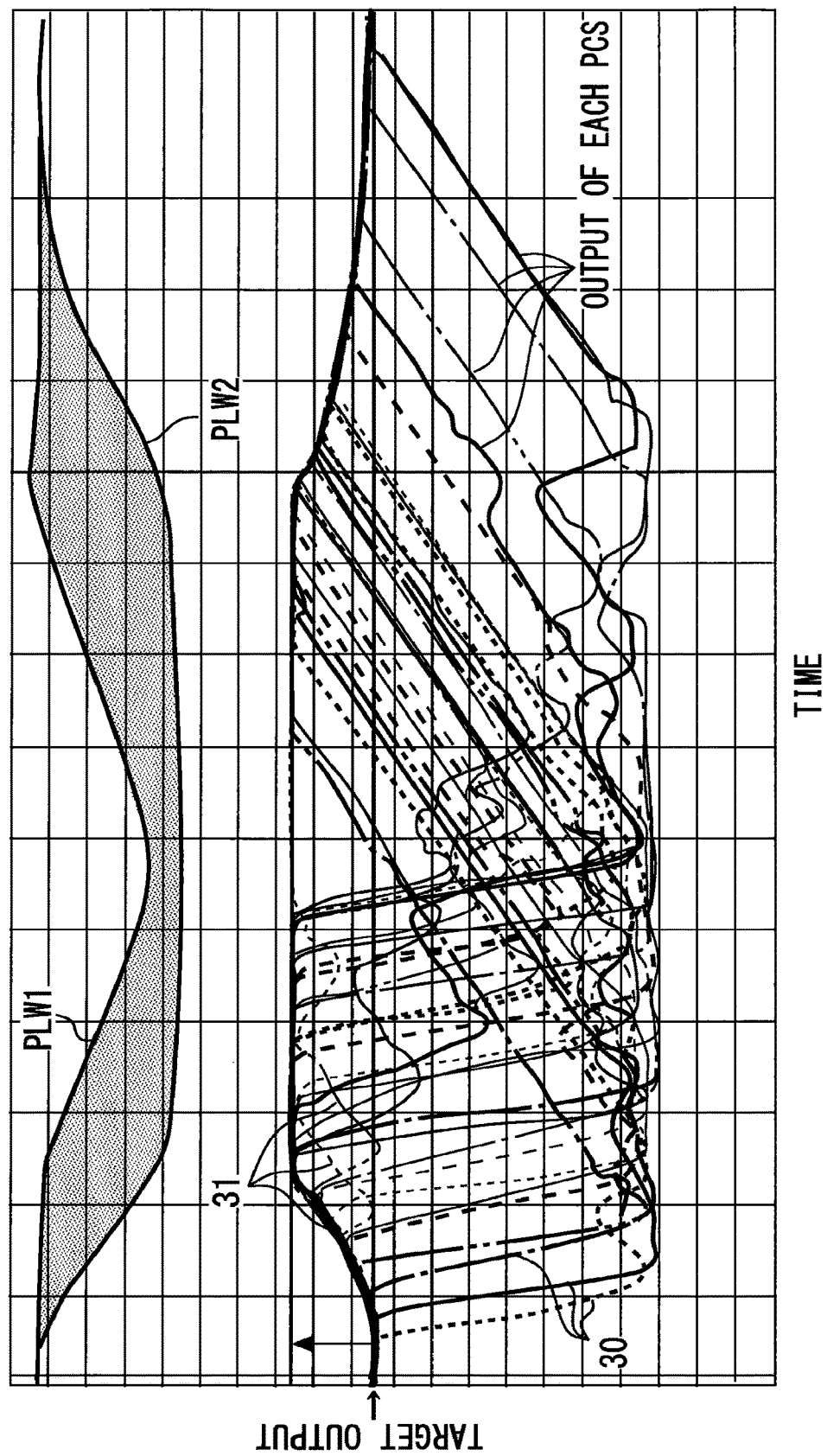
FIG. 8 is a diagram showing an example of a change in electrical power when a shortage of output in a part of the power conditioning systems is compensated for with output of other power conditioning systems having surplus power in the control system for a solar power plant according to the first embodiment.

FIG. 8 is a diagram showing an example of a change in electrical power when a shortage of output in a part of the power conditioning systems 3 is compensated for with output of other power conditioning systems 3 having surplus power in the control system 1 for a solar power plant according to the present first embodiment. A graph in a lower half of FIG. 8 shows a change in the output of each power conditioning system 3. An output reduction 30 in FIG. 8 is caused by the solar power generator 2 becoming shadowed by a cloud. As a plurality of the solar power generators 2 consecutively become shadowed by clouds, output of a plurality of power conditioning system 3 consecutively decreases. In order to compensate for the shortage of output of these power conditioning systems 3, the supervisory controller 10 increases the outputs of other power conditioning systems 3 having surplus power as indicated by an output increase 31 in FIG. 8. A graph in an upper half of FIG. 8 shows a change in the interconnection point electrical power PLW. PLW1 in FIG. 8 indicates a change in the interconnection point electrical power PLW when the control described above is performed by the supervisory controller 10. In other words, PLW1 corresponds to a sum of outputs of the respective power conditioning systems 3 in the lower half of FIG. 8. PLW2 in FIG. 8 indicates a change in the interconnection point electrical power PLW when the control described above is not performed by the supervisory controller 10. In PLW1, a reduction in output is decreased as compared to PLW2. In this manner, by having the supervisory controller 10 perform control so that a shortage of output in a part of the power conditioning systems 3 is compensated for with output of other power conditioning systems 3 having surplus power, a reduction in the interconnection point electrical power PLW can be reliably decreased and an amount of electrical power to be transmitted to the power grid 7 or, in other words, an amount of sold electrical power can be increased.

Second Embodiment

Figure 9:
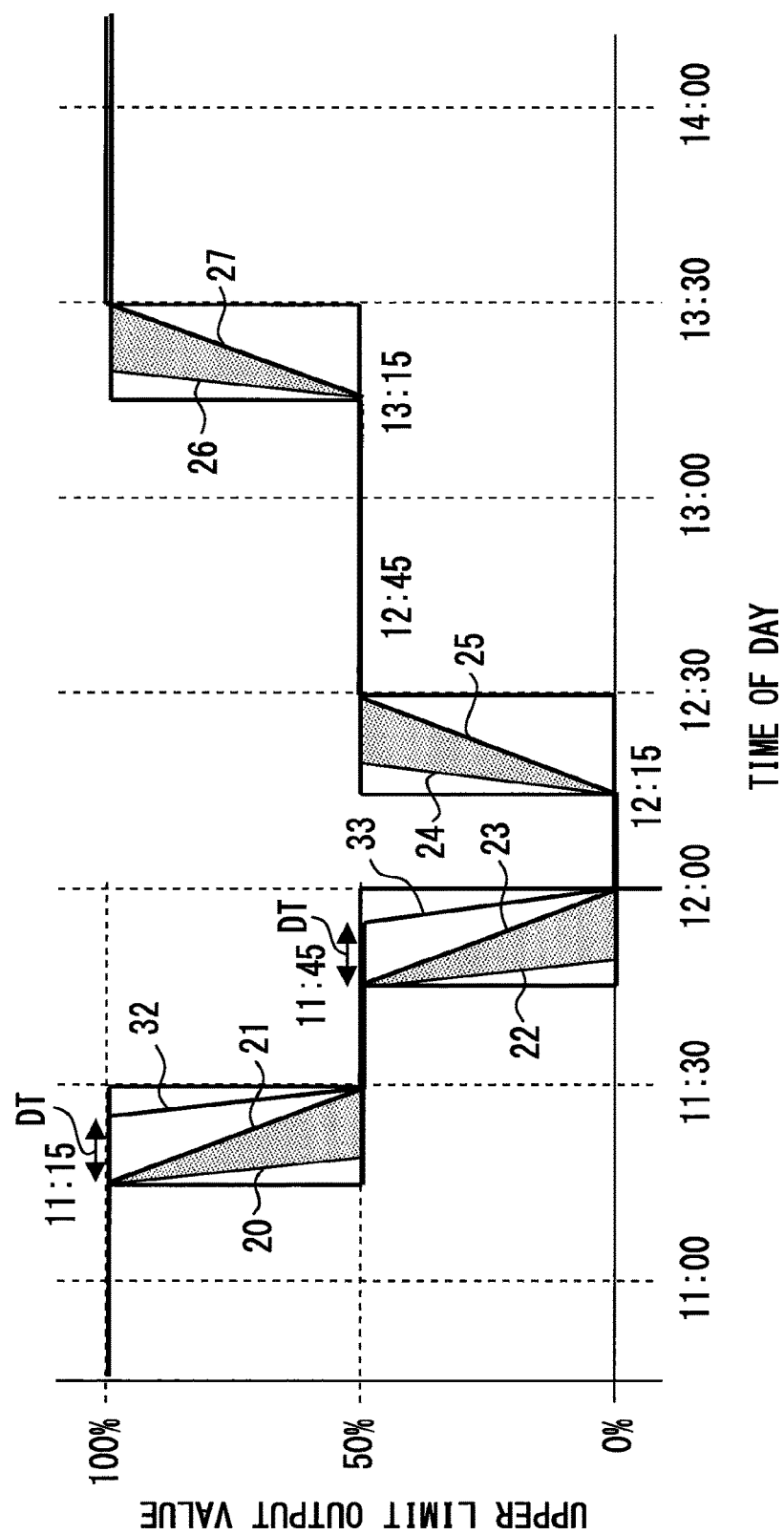
FIG. 9 is a time chart for explaining a method by which a supervisory controller calculates a target value of the interconnection point electrical power PLW for each time of day according to a second embodiment.

Next, while a second embodiment of the present invention will be described with reference to FIG. 9, the description will focus on differences from the first embodiment described above and portions that are the same as or equivalent to portions already described will be denoted by the same reference signs and description thereof will be omitted. FIG. 9 is a time chart for explaining a method by which the supervisory controller 10 calculates a target value of the interconnection point electrical power PLW for each time of day according to the present second embodiment. Contents of the urgent requests shown in FIG. 9 are similar to those shown in FIG. 3.

In the example shown in FIG. 9, an urgent request is received at 11:15. This urgent request notifies that the upper limit output value is scheduled to be changed at 11:30 from 100% to 50%. In the present second embodiment, when reducing the interconnection point electrical power PLW in response to an urgent request, the supervisory controller 10 performs control so as to start reducing the interconnection point electrical power PLW at a later time of day than the time of day at which the urgent request is received instead of immediately starting to reduce the interconnection point electrical power PLW. A delay time DT in FIG. 9 refers to a period from the time of day at which the urgent request is received to the time of day at which reduction of the interconnection point electrical power PLW is started. A line 32 in FIG. 9 is a line which enables a longest delay time DT within a range satisfying the urgent request received at 11:15. A rate of reduction of the interconnection point electrical power PLW on the line 32 corresponds to a most rapid permissible limit. In the case of the line 32, the interconnection point electrical power PLW drops at a constant pace (a pace equivalent to the permissible limit) from 100% at 11:25:50 seconds to 50% at 11:30. In the case of the line 32, the delay time DT is 10 minutes 50 seconds.

When the interconnection point electrical power PLW is reduced along the line 32, an amount of electrical power to be transmitted to the power grid 7 or, in other words, an amount of sold electrical power can be increased as compared to when the interconnection point electrical power PLW is reduced along the line 21. In the present second embodiment, when reducing the interconnection point electrical power PLW in response to the urgent request at 11:15, desirably, the delay time DT is provided and the supervisory controller 10 calculates a target value of the interconnection point electrical power PLW for each time of day along the line 32 or a nearby line. In this case, the delay time DT may be set shorter than the period described above to provide more leeway.

In the example shown in FIG. 9, subsequently, an urgent request is received at 11:45. This urgent request notifies that the upper limit output value is scheduled to be changed at 12:00 from 50% to 0%. A line 33 in FIG. 9 is a line which enables a longest delay time DT within a range satisfying the urgent request received at 11:45. A rate of reduction of the interconnection point electrical power PLW on the line 33 corresponds to a most rapid permissible limit. In the case of the line 33, the interconnection point electrical power PLW drops at a constant pace (a pace equivalent to the permissible limit) from 50% at 11:55:50 seconds to 0% at 12:00. In the case of the line 33, the delay time DT is 10 minutes 50 seconds.

When the interconnection point electrical power PLW is reduced along the line 33, an amount of electrical power to be transmitted to the power grid 7 or, in other words, an amount of sold electrical power can be increased as compared to when the interconnection point electrical power PLW is reduced along the line 23. In the present second embodiment, when reducing the interconnection point electrical power PLW in response to the urgent request at 11:45, desirably, the delay time DT is provided and the supervisory controller 10 calculates a target value of the interconnection point electrical power PLW for each time of day along the line 33 or a nearby line. In this case, the delay time DT may be set shorter than the period described above to provide more leeway.

In the example shown in FIG. 9, subsequently, urgent requests are received at 12:15 and 13:15. These urgent requests notify that the upper limit output value is scheduled to be increased. In the present second embodiment, when increasing the interconnection point electrical power PLW in response to an urgent request, the supervisory controller 10 immediately starts to increase the interconnection point electrical power PLW. Since control when increasing the interconnection point electrical power PLW in response to an urgent request is similar to that in the first embodiment, a description thereof will be omitted.

As described above, in the present second embodiment, the supervisory controller 10 desirably increases the period from the time of day at which an urgent request is received to the time of day at which a reduction of the interconnection point electrical power PLW is started in response to the urgent request as compared to the period from the time of day at which an urgent request is received to the time of day at which an increase of the interconnection point electrical power PLW is started in response to the urgent request. In other words, the supervisory controller 10 desirably provides a delay time DT before starting to reduce the interconnection point electrical power PLW in response to an urgent request but does not provide the delay time DT before starting to increase the interconnection point electrical power PLW in response to an urgent request. Accordingly, an amount of electrical power to be transmitted to the power grid 7 or, in other words, an amount of sold electrical power can be further increased as compared to the first embodiment.

REFERENCE SIGNS LIST

1 control system for a solar power plant
2 solar power generator
3 power conditioning system
4 interconnecting transformer
5 main transformer
6 wattmeter
7 power grid
10 supervisory controller
11 receiving unit
12 calculating unit
13 transmitting unit
20, 21, 22, 23, 24, 25, 26, 27, 28, 32, 33 line
30 output reduction
31 output increase
121 storage unit
122 CPU

The invention claimed is:

1. A control system for a solar power plant, comprising:
a plurality of power conditioning systems, each power conditioning system being configured to perform grid connection control of transmission of electrical power generated by a solar power generator to a power grid; and
a supervisory controller configured to issue a target output command to each power conditioning system so that interconnection point electrical power becomes equal to or smaller than an upper limit output value, the interconnection point electrical power being electrical power fed to the power grid, wherein
the supervisory controller includes
a receiver configured to receive an urgent request including information related to a time of day at which the upper limit output value is scheduled to be changed and a scheduled upper limit output value, and
a calculator configured to
calculate a target value of the interconnection point electrical power for each time of day so that the interconnection point electrical power conforms to the scheduled upper limit output value by the time of day scheduled in the urgent request and that a pace of change in the interconnection point electrical power does not exceed a permissible limit, and
calculate a target output of each power conditioning system for each time of day based on the target value, and
the supervisory controller is further configured to adjust a pace at which the interconnection point electrical power is increased in response to the urgent request faster than a pace at which the interconnection point electrical power is reduced in response to the urgent request, the urgent request being indicative of two separate urgent events, a first for reducing the interconnection point electric power, and a second for increasing the interconnection point electric power.

2. The control system for a solar power plant according to claim 1, wherein the supervisory controller is further configured to increase a period from a time of day at which the urgent request is received to a time of day at which a reduction of the interconnection point electrical power is started in response to the urgent request, as compared to a period from the time of day at which the urgent request is received to a time of day at which an increase of the interconnection point electrical power is started in response to the urgent request.

3. The control system for a solar power plant according to claim 1, wherein the supervisory controller is further configured to calculate the target output of each power conditioning system such that a shortage of output in a part of the power conditioning systems is compensated for with output of other power conditioning systems.

4. The control system for a solar power plant according to claim 1, wherein the supervisory controller is further configured to calculate the target output of each power conditioning system such that a shortage of output in a part of the power conditioning systems is compensated for with output of other power conditioning systems.

5. The control system for a solar power plant according to claim 2, wherein the supervisory controller is further configured to calculate the target output of each power conditioning system such that a shortage of output in a part of the power conditioning systems is compensated for with output of other power conditioning systems.

* * * * *